US009698801B2

(12) United States Patent
Fujiwara et al.

(10) Patent No.: US 9,698,801 B2
(45) Date of Patent: Jul. 4, 2017

(54) PHASE LOCKED LOOP CIRCUIT CONTROL DEVICE AND CONTROL METHOD OF PHASE LOCKED LOOP CIRCUIT

(71) Applicant: FUJITSU LIMITED, Kawasaki-shi, Kanagawa (JP)

(72) Inventors: Shinnosuke Fujiwara, Kawasaki (JP); Michiharu Hara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 15/064,685

(22) Filed: Mar. 9, 2016

(65) Prior Publication Data
US 2016/0352342 A1    Dec. 1, 2016

(30) Foreign Application Priority Data
May 25, 2015 (JP) .................................. 2015-105572

(51) Int. Cl.
*H03L 7/06* (2006.01)
*H03L 7/16* (2006.01)
*H03L 7/10* (2006.01)

(52) U.S. Cl.
CPC . *H03L 7/16* (2013.01); *H03L 7/10* (2013.01)

(58) Field of Classification Search
CPC .................................. H03L 7/10; H03L 7/16
USPC ........................................................ 327/156
See application file for complete search history.

(56) References Cited

U.S. PATENT DOCUMENTS

| 7,512,821 | B2 * | 3/2009 | Ueda ..................... G06F 1/3203 713/100 |
| 7,693,611 | B2 * | 4/2010 | Mills ..................... H04M 19/08 700/297 |
| 8,601,303 | B2 * | 12/2013 | Ogawa .................... G06F 1/266 713/310 |
| 9,189,053 | B2 * | 11/2015 | Cui ........................ G06F 1/3203 |
| 9,454,197 | B2 * | 9/2016 | Tanaka .................. H02M 3/155 |
| 2003/0212916 | A1 * | 11/2003 | Ito ........................ G06F 17/5045 713/322 |
| 2013/0249610 | A1 * | 9/2013 | Hara ........................ H03L 7/00 327/159 |

FOREIGN PATENT DOCUMENTS

| JP | 06-004169 | 1/1994 |
| JP | 2003-330549 | 11/2003 |
| JP | 2013-196619 | 9/2013 |

* cited by examiner

*Primary Examiner* — Ryan Jager
(74) *Attorney, Agent, or Firm* — Fujitsu Patent Center

(57) ABSTRACT

A phase locked loop circuit control device includes: a phase locked loop circuit configured to generate a clock signal; and a control unit configured to, when being instructed to change a frequency of the clock signal from a current frequency to a target frequency, control the phase locked loop circuit to make the frequency change stepwise from the current frequency to the target frequency, in which the control unit changes the frequency of the clock signal by a first change amount in a first frequency range out of the range of the current frequency to the target frequency, and changes the frequency of the clock signal by a second change amount in a second frequency range out of the range of the current frequency to the target frequency.

13 Claims, 8 Drawing Sheets

F I G. 1
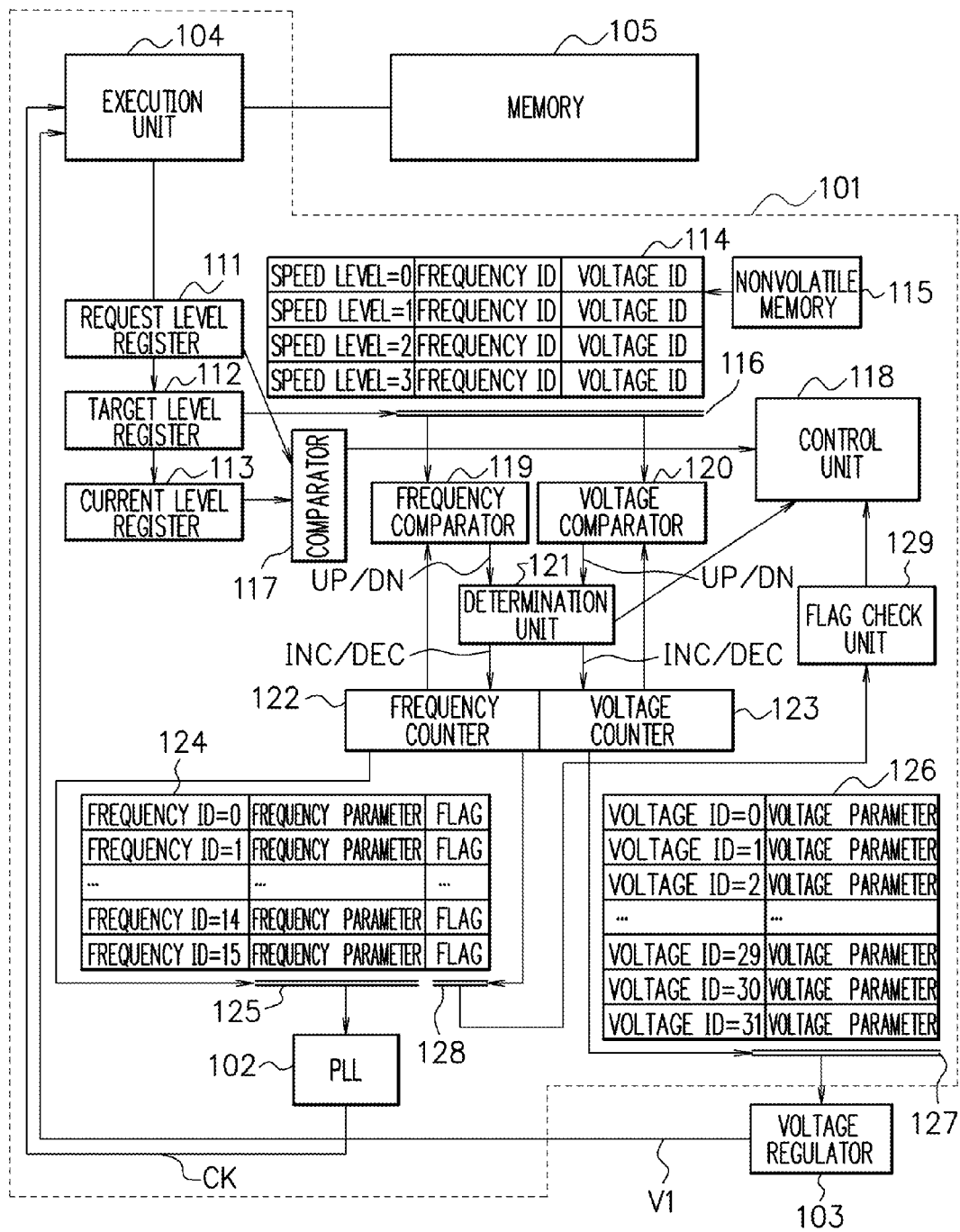

| FREQUENCY ID | FREQUENCY PARAMETER | FLAG |
|---|---|---|
| 0 | 0.1GHz | 0 |
| 1 | 0.2GHz | 1 |
| 2 | 0.3GHz | 0 |
| 3 | 0.4GHz | 0 |
| 4 | 0.5GHz | 0 |
| 5 | 0.6GHz | 1 |
| 6 | 0.7GHz | 0 |
| 7 | 0.8GHz | 0 |
| 8 | 0.9GHz | 0 |
| 9 | 1.0GHz | 1 |
| 10 | 1.1GHz | 1 |
| 11 | 1.2GHz | 1 |
| 12 | 1.3GHz | 0 |
| 13 | 1.4GHz | 0 |
| 14 | 1.5GHz | 0 |
| 15 | 1.6GHz | 0 |

| VOLTAGE ID | VOLTAGE PARAMETER |
|---|---|
| 0 | 0.20V |
| 1 | 0.25V |
| 2 | 0.30V |
| 3 | 0.35V |
| 4 | 0.40V |
| 5 | 0.45V |
| 6 | 0.50V |
| 7 | 0.55V |
| 8 | 0.60V |
| 9 | 0.65V |
| 10 | 0.70V |
| 11 | 0.75V |
| 12 | 0.80V |
| 13 | 0.85V |
| 14 | 0.90V |
| 15 | 0.95V |
| 16 | 1.00V |
| 17 | 1.05V |
| 18 | 1.10V |
| 19 | 1.15V |
| ... | ... |
| 28 | 1.60V |
| 29 | 1.65V |
| 30 | 1.70V |
| 31 | 1.75V |

| | 2 | 1 | 0 |
|---|---|---|---|
| 111 | ERROR | SPEED LEVEL | |
| | 301 | 302 | |

| SPEED LEVEL ~302 | FREQUENCY (PROCESSING PERFORMANCE) |
|---|---|
| 0 | 120% |
| 1 (STANDARD) | 100% |
| 2 | 60% |
| 3 | 20% |

| SPEED LEVEL | FREQUENCY ID | VOLTAGE ID |
|---|---|---|
| 0 | 11 (1.2GHz) | 28 (1.60V) |
| 1 (STANDARD) | 9 (1.0GHz) | 18 (1.10V) |
| 2 | 5 (0.6GHz) | 15 (0.95V) |
| 3 | 1 (0.2GHz) | 2 (0.30V) |

~114

| SPEED LEVEL | FREQUENCY ID | VOLTAGE ID |
|---|---|---|
| 0 | 11 (1.2GHz) | 29 (1.65V) |
| 1 (STANDARD) | 9 (1.0GHz) | 19 (1.15V) |
| 2 | 5 (0.6GHz) | 15 (0.95V) |
| 3 | 1 (0.2GHz) | 2 (0.30V) |

~114

| SPEED LEVEL | FREQUENCY ID | VOLTAGE ID |
|---|---|---|
| 0 | 12 (1.3GHz) | 30 (1.70V) |
| 1 (STANDARD) | 11 (1.2GHz) | 29 (1.65V) |
| 2 | 7 (0.8GHz) | 17 (1.05V) |
| 3 | 3 (0.4GHz) | 3 (0.35V) |

~114

| FREQUENCY COMPARATOR | | VOLTAGE COMPARATOR | | NEXT STATE |
|---|---|---|---|---|
| UP | DN | UP | DN | |
| 0 | 0 | 0 | 0 | IDLE |
| 0 | 0 | 0 | 1 | VOLTAGE COUNT |
| 0 | 0 | 1 | 0 | VOLTAGE COUNT |
| 0 | 0 | 1 | 1 | ERROR |
| 0 | 1 | 0 | 0 | FREQUENCY COUNT |
| 0 | 1 | 0 | 1 | FREQUENCY COUNT |
| 0 | 1 | 1 | 0 | ERROR |
| 0 | 1 | 1 | 1 | ERROR |
| 1 | 0 | 0 | 0 | FREQUENCY COUNT |
| 1 | 0 | 0 | 1 | ERROR |
| 1 | 0 | 1 | 0 | VOLTAGE COUNT |
| 1 | 0 | 1 | 1 | ERROR |
| 1 | 1 | 0 | 0 | ERROR |
| 1 | 1 | 0 | 1 | ERROR |
| 1 | 1 | 1 | 0 | ERROR |
| 1 | 1 | 1 | 1 | ERROR |

F I G. 9
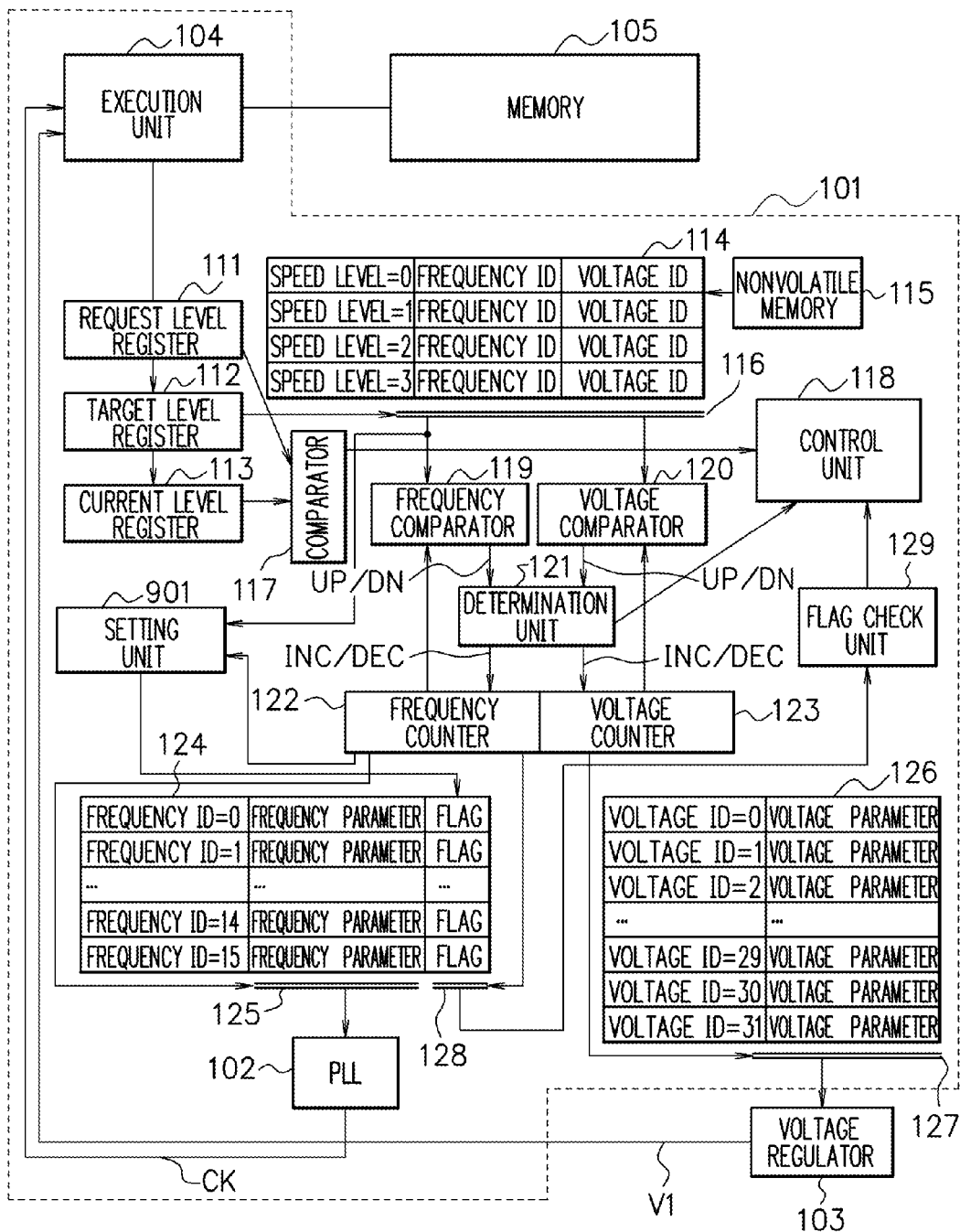

| CURRENT FREQUENCY ID | TARGET FREQUENCY ID | FLAG | | | | | | | | | | | | | | | |
|---|---|---|---|---|---|---|---|---|---|---|---|---|---|---|---|---|
| | | ID 0 | ID 1 | ID 2 | ID 3 | ID 4 | ID 5 | ID 6 | ID 7 | ID 8 | ID 9 | ID 10 | ID 11 | ID 12 | ID 13 | ID 14 | ID 15 |
| 11 | 9 | 0 | 0 | 0 | 0 | 0 | 0 | 0 | 0 | 0 | 1 | 1 | 1 | 0 | 0 | 0 | 0 |
| 11 | 5 | 0 | 0 | 0 | 0 | 0 | 1 | 0 | 0 | 0 | 1 | 1 | 1 | 0 | 0 | 0 | 0 |
| 11 | 1 | 0 | 1 | 0 | 0 | 0 | 0 | 0 | 0 | 0 | 1 | 1 | 1 | 0 | 0 | 0 | 0 |
| 9 | 11 | 0 | 0 | 0 | 0 | 0 | 0 | 0 | 0 | 0 | 1 | 1 | 1 | 0 | 0 | 0 | 0 |
| 9 | 5 | 0 | 0 | 0 | 0 | 0 | 1 | 0 | 1 | 1 | 1 | 0 | 0 | 0 | 0 | 0 | 0 |
| 9 | 1 | 0 | 1 | 0 | 0 | 0 | 0 | 0 | 1 | 1 | 1 | 0 | 0 | 0 | 0 | 0 | 0 |
| 5 | 11 | 0 | 0 | 0 | 0 | 0 | 0 | 0 | 0 | 0 | 1 | 1 | 1 | 0 | 0 | 0 | 0 |
| 5 | 9 | 0 | 0 | 0 | 0 | 0 | 0 | 0 | 1 | 1 | 1 | 0 | 0 | 0 | 0 | 0 | 0 |
| 5 | 1 | 0 | 1 | 0 | 1 | 1 | 1 | 0 | 0 | 0 | 0 | 0 | 0 | 0 | 0 | 0 | 0 |
| 1 | 11 | 0 | 0 | 0 | 0 | 0 | 0 | 0 | 0 | 0 | 1 | 1 | 1 | 0 | 0 | 0 | 0 |
| 1 | 9 | 0 | 0 | 0 | 0 | 0 | 0 | 0 | 1 | 1 | 1 | 0 | 0 | 0 | 0 | 0 | 0 |
| 1 | 5 | 0 | 0 | 0 | 1 | 1 | 1 | 0 | 0 | 0 | 0 | 0 | 0 | 0 | 0 | 0 | 0 |

US 9,698,801 B2

PHASE LOCKED LOOP CIRCUIT CONTROL DEVICE AND CONTROL METHOD OF PHASE LOCKED LOOP CIRCUIT

CROSS-REFERENCE TO RELATED APPLICATION

This application is based upon and claims the benefit of priority of the prior Japanese Patent Application No. 2015-105572, filed on May 25, 2015, the entire contents of which are incorporated herein by reference.

FIELD

The embodiments discussed herein are directed to a phase locked loop circuit control device and a control method of a phase locked loop circuit.

BACKGROUND

There has been known a semiconductor integrated circuit including: a CPU; a clock generation circuit; and a power supply circuit (see Patent Document 1). The clock generation circuit supplies an operational clock signal to the CPU. The CPU specifies a frequency of the operational clock signal for the clock generation circuit and specifies an internal power supply voltage for the power supply circuit. The power supply circuit includes: a voltage regulator to generate an internal power supply voltage from an external power supply voltage; and a determination circuit to determine a transition state to the specified internal power supply voltage. The determination circuit receives input of a first signal output from the CPU and then determines attainment to the specified internal power supply voltage to output a second signal to the CPU.

Further, there has been known a semiconductor device including a source voltage detection circuit that is attached on a system clock generation circuit of a semiconductor integrated circuit so that a frequency of a CPU system clock can be automatically changed (see Patent Document 2).

Further, there has been known a semiconductor device including an oscillation unit that supplies an oscillated clock to a circuit included in the semiconductor device (see Patent Document 3). A frequency setting information storage unit stores a plurality of sets of frequency information indicating setting of a frequency supplied by the oscillation unit and frequency identification information identifying the frequency information and outputs one of a plurality of pieces of the frequency information to the oscillation unit based on frequency identification information input thereinto. A speed setting information storage unit stores speed identification information indicating a speed of the semiconductor device and frequency identification information corresponding to the speed identification information. A frequency identification information count unit holds a value of the frequency identification information input into the frequency setting information storage unit. A control unit causes the frequency identification information count unit to increment or decrement the held value of the frequency identification information to approach a value of the frequency identification information stored in the speed setting information storage unit.

[Patent Document 1] Japanese Laid-open Patent Publication No. 2003-330549
[Patent Document 2] Japanese Laid-open Patent Publication No. 06-4169
[Patent Document 3] Japanese Laid-open Patent Publication No. 2013-196619

When a frequency of a clock signal is changed not stepwise but greatly during the operation of a processor, a load greatly changes to cause a large power supply noise as a result. Therefore, when changing the frequency, it is preferred to perform control such as not to change it to a target value at once but to change it stepwise to the target value. However, when the frequency is changed stepwise, there is generated a problem that a time period for changing the frequency from a current frequency to a target frequency is prolonged.

SUMMARY

A phase locked loop circuit control device includes: a phase locked loop circuit configured to generate a clock signal; and a control unit configured to, when being instructed to change a frequency of the clock signal from a current frequency to a target frequency, control the phase locked loop circuit to make the frequency change stepwise from the current frequency to the target frequency, in which the control unit changes the frequency of the clock signal by a first change amount in a first frequency range out of the range of the current frequency to the target frequency, and changes the frequency of the clock signal by a second change amount in a second frequency range out of the range of the current frequency to the target frequency.

The object and advantages of the invention will be realized and attained by means of the elements and sets particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a semiconductor device according to a first embodiment;

FIG. 2A is a diagram illustrating an example of a frequency table, and FIG. 2B is a diagram illustrating an example of a voltage table;

FIG. 9 is a diagram illustrating a configuration example of a semiconductor device according to a second embodiment;

DESCRIPTION OF EMBODIMENTS

First Embodiment

Figures 3A, 3B, 4A, 4B, 4C:
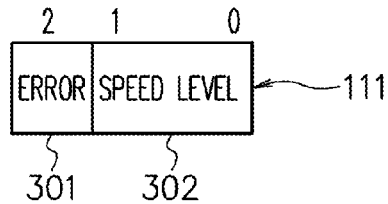
FIGS. 3A and 3B are diagrams for explaining a request level register.
FIGS. 4A to 4C are diagrams illustrating examples of a speed level table.

FIG. 1 is a diagram illustrating a configuration example of a semiconductor device according to a first embodiment.

The semiconductor device is a phase locked loop circuit control device, and includes: an arithmetic processing device 101; a voltage regulator 103; and a memory 105. The arithmetic processing device 101 is, for example, a processor and includes: a phase locked loop (PLL: Phase Locked Loop) circuit 102; an execution unit 104; a request level register 111; a target level register 112; a current level register 113; a speed level table 114; a nonvolatile memory 115; a speed level selector 116; a comparator 117; a control unit 118; a frequency comparator 119; a voltage comparator 120; a determination unit 121; a frequency counter 122; a voltage counter 123; a frequency table 124; a frequency selector 125; a voltage table 126; a voltage selector 127; a flag selector 128; and a flag check unit 129. To the arithmetic processing device 101, the memory 105 and the voltage regulator 103 are connected.

As the arithmetic processing device 101 is highly improved in performance and integrated, power that the arithmetic processing device 101 consumes needs to be decreased. Power consumption of the arithmetic processing device 101 is proportional to the product of the square of a power supply voltage V1 and the frequency of a clock signal CK. Therefore, appropriately controlling the frequency and the voltage are desired in order to reduce the power consumption of the arithmetic processing device 101. However, due to individual differences caused by kinds of the arithmetic processing device 101 and variations in semiconductor process to manufacture the arithmetic processing device 101, an appropriate frequency parameter and an appropriate voltage parameter differ in each arithmetic processing device 101. Therefore, in order to appropriately control the frequency parameter and the voltage parameter, such control as to absorb the kinds of the arithmetic processing device 101 and the variations in semiconductor process is needed.

The arithmetic processing device 101 inputs a frequency parameter (frequency information) into the phase locked loop circuit 102 to perform setting of a frequency and inputs a voltage parameter (voltage information) into the voltage regulator 103 to perform setting of a voltage. The phase locked loop circuit 102 generates a clock signal CK having a frequency according to the input frequency parameter and outputs the clock signal CK to the execution unit 104. The execution unit 104 executes a program (including OS: Operating System) stored in the memory 105 in synchronization with the clock signal CK to perform various kinds of processing. The voltage regulator 103 is a power supply unit to generate a voltage V1 with a magnitude according to the input voltage parameter and output the voltage V1 to the execution unit 104. The execution unit 104 receives supply of the voltage V1 to operate. The arithmetic processing device 101 can control the frequency of the clock signal CK by the frequency parameter and control the magnitude of the voltage V1 by the voltage parameter.

Here, a problem in the case where the execution unit 104 executes the program to control the frequency parameter of the phase locked loop circuit 102 and the voltage parameter of the voltage regulator 103 will be explained, for example.

In recent years, in the field of semiconductor devices such as a SoC (System on Chip) including a processor, an ASIC (Application Specific Integrated Circuit) and so on, the semiconductor device is manufactured in cooperation by division system of a user manufacturer that plans and designs the semiconductor and a semiconductor foundry that manufactures the semiconductor. When the semiconductor device is manufactured by division system of the user manufacturer and the semiconductor foundry, the phase locked loop circuit 102 is built in the arithmetic processing device 101 and provided to the user manufacturer from the semiconductor foundry, but there is no standardized interface and the kind and the value of the frequency parameter are different for each semiconductor foundry. Further, even in the same semiconductor foundry, the kind and the value of the frequency parameter are different depending on the kind of the phase locked loop circuit 102 and the generation of the semiconductor process, and therefore, when providing the arithmetic processing device 101 employing a new phase locked loop circuit 102, it is necessary, first of all, to support the phase locked loop circuit 102 by the program and thus impossible to easily provide a new arithmetic processing device 101.

Further, the change of the voltage V1 is performed using an interface (VID) that is the standard in the industry. The voltage regulator 103 needs to generate an appropriate voltage V1 for the arithmetic processing device 101 to operate at the frequency of the clock signal CK. Since the setting value of the appropriate voltage V1 is a value different for each individual chip of the arithmetic processing device 101 determined in various tests during manufacture of the arithmetic processing device 101, the program needs to know the appropriate voltage parameter for each chip and change the voltage parameter for each chip.

Further, if the frequency of the clock signal CK is changed not stepwise but greatly during the operation of the arithmetic processing device 101, the load greatly changes to cause a large power supply noise as a result. Further, if the voltage V1 is changed not stepwise but greatly, the power supply becomes unstable to make the operation of circuits in the arithmetic processing device 101 unstable. Therefore, when changing the frequency and the voltage, it is necessary to perform control such as not to change them to target values at once but to change them stepwise to the target values.

Further, the change of the frequency and the voltage needs time on the order of microsecond to millisecond at one time. When this processing is performed by the program operating on the arithmetic processing device 101, the operation of the change of the frequency or the voltage and the operation of waiting for the change completion will be repeatedly performed to waste the processing ability of the arithmetic processing device 101. Further, how much the change may be performed at one time depends on the design of the arithmetic processing device 101 and the power supply, resulting in that the program depends on the hardware of the arithmetic processing device 101 that is the object to be changed.

Hereinafter, an embodiment to solve the above-described problems will be explained. FIG. 2A is a diagram illustrating an example of the frequency table 124 in FIG. 1, and a frequency in a unit of 0.1 GHz at 16 steps can be controlled. The frequency table 124 stores a plurality of sets of frequency identifiers (frequency ID: Identification) "0" to "15" and frequency parameters (frequency information) of "0.1" GHz to "1.6" GHz and flags in the order of frequency and in the order of the frequency identifier. The frequency parameter is a digital code for controlling the frequency of the clock signal CK generated by the phase locked loop circuit 102. For example, "0" of the frequency identifier is stored in association with the frequency parameter of a frequency of 0.1 GHz and "0" of the flag, and "1" of the frequency identifier is stored in association with the frequency parameter of a frequency of 0.2 GHz and "1" of the flag. Then, the frequency parameters in the frequency table 124 are similarly stored in the order of the frequency identifiers "0" to "15" and in the order of the frequencies of "0.1" GHz to "1.6" GHz. The orders may be either ascending orders or descending orders.

FIG. 2B is a diagram illustrating an example of the voltage table 126 in FIG. 1, and a voltage in a unit of 0.05 V at 32 steps can be controlled. The voltage table 126 stores a plurality of sets of voltage identifiers (voltage ID: Identification) "0" to "31" and voltage parameters of "0.20" V to "1.75" V in the order of voltage and in the order of the voltage identifier. The voltage parameter is a digital code for controlling the value of the voltage V1 generated by the voltage regulator 103. For example, "0" of the voltage identifier is stored in association with the voltage parameter of a voltage of 0.20 V and "1" of the voltage identifier is stored in association with the voltage parameter of a voltage of 0.25 V. Then, the voltage parameters in the voltage table 126 are similarly stored in the order of the voltage identifiers "0" to "31" and in the order of the voltages of "0.20" V to "1.75" V. The orders may be either ascending orders or descending orders.

The frequency table 124 and the voltage table 126 described above may also be configured so that a part thereof is composed of a variable register and the other part is composed of a simple connection to a power supply potential node or a ground potential node (ground node) to take a fixed value. A part of fixed values of the frequency table 124 and the voltage table 126 that are never changed can be realized by a simple configuration, and even if the variation ranges of frequency and voltage are increased, the circuit scale can be reduced.

That is, the relation between the frequency identifier and the frequency parameter in the frequency table 124 and the relation between the voltage identifier and the voltage parameter in the voltage table 126 are determined at the design stage of the arithmetic processing device 101, and many of the concrete value of each frequency parameter to the phase locked loop circuit 102 and the concrete value of each voltage parameter to the voltage regulator 103 are determined at the design stage. Therefore, it is possible that most of the frequency parameters and the voltage parameters are constituted not by an updatable register but by a simple connection to the power supply potential node or the ground potential node, and only parameters requiring adjustment after the manufacture are constituted of an updatable register, and thereby the circuit area can be reduced.

In FIG. 1, the execution unit 104 executes the program stored in the memory 105 to thereby write a requesting speed level into the request level register 111 about the speed level that is the rate of change of the frequency when the standard operating frequency during system operation is set to 100%. The execution unit 104 only writes the speed level into the request level register 111 to thereby enable control of the frequency parameter of the phase locked loop circuit 102 and the voltage parameter of the voltage regulator 103.

The request level register 111 stores the speed level requested from the execution unit 104. When the control unit 118 is in an idle state and the speed level held in the request level register 111 is different from the speed level held in the current level register 113 as a result of comparing the request level register 111 with the current level register 113 by the comparator 117, the target level register 112 causes the control unit 118 to transit from the idle state to a control state, and stores therein the speed level in the request level register 111 at the point in time when starting the control as the target speed level in the control state. When the control unit 118 is in an idle state, the current level register 113 stores the current speed level.

The target level register 112 stores the target speed level in the control state at present, so that the execution unit 104 can write the next speed level into the request level register 111 without waiting for completion of the control by the control unit 118 even in the middle of control. Even if the writing has been performed, the above-described control by the control unit 118 is continued and the request from the execution unit 104 is held in the request level register 111. After completion of the control by the control unit 118, the current level register 113 stores therein the speed level in the target level register 112, and the comparator 117 compares the speed level of the request level register 111 held in the request level register 111 with the current level register 113, and when the speed levels are different, the new speed level held in the request level register 111 is written into the target level register 112, and control for the next target speed level is started. This control is performed by the control unit 118, and therefore does not need to be performed by the execution unit 104. The execution unit 104 enables control of the frequency parameter and the voltage parameter by simple processing of writing the speed level into the request level register 111.

FIGS. 3A and 3B are diagrams for explaining the request level register 111 in FIG. 1. FIG. 3A is a diagram illustrating a bit format example of the request level register 111. The request level register 111 is a 3-bit register and stores error information 301 of one bit and a speed level 302 of two bits. As for the error information 301, "0" indicates no error, and "1" indicates an error. The content of error will be explained later with reference to FIG. 6. The speed level 302 will be explained with reference to FIG. 3B.

FIG. 3B is a diagram for explaining the speed level 302 in FIG. 3A. The speed level 302 has, for example, four levels of "0" to "3" and indicates the speed of the arithmetic processing device 101. The speed level 302 of "1" is a standard speed level during system operation of the arithmetic processing device 101, and, for example, the frequency (processing performance) at this level is regarded as 100%. The speed level 302 of "0" is a speed level higher than the speed level 302 of "1" and, for example, the frequency (processing performance) at this level is 120%. The speed level 302 of "2" is a speed level lower than the speed level 302 of "1" and, for example, the frequency (processing performance) at this level is 60%. The speed level 302 of "3" is a speed level lower than the speed level 302 of "2" and, for example, the frequency (processing performance) at this level is 20%. In the example in FIG. 3B, the speed level 302 is defined as having two levels in increments of 40% in a direction of decreasing the frequency (decreasing performance) and one level in increments of 20% in a direction of increasing the frequency (increasing performance). The execution unit 104 can write the speed level 302 into the request level register 111 according to processing contents such as a high-speed processing mode, a low-speed processing mode, and a sleep mode.

FIGS. 4A to 4C are diagrams illustrating examples of the speed level table 114 in FIG. 1. The speed level table 114 stores a plurality of sets of frequency identifiers and voltage identifiers corresponding to speed levels. The speed levels correspond to the speed levels in FIG. 3B, and the frequency identifiers correspond to the frequency identifiers in FIG. 2A, and the voltage identifiers correspond to the voltage identifiers in FIG. 2B.

The speed level table 114 in FIG. 4A will be first explained. In the speed level table 114, the relationship between the frequency and the voltage in a semiconductor circuit is defined in which as the frequency of the semiconductor circuit increases, the voltage needed by the semiconductor circuit also increases. The speed level of "1" is associated with a frequency identifier "9" and a voltage identifier "18." The frequency identifier "9" corresponds, for example, to a frequency parameter of "1.0" GHz as illustrated in FIG. 2A. The voltage identifier "18" corresponds, for example, to a voltage parameter of "1.10" V as illustrated in FIG. 2B. As described above, the speed level of "1" means the frequency of "1.0" GHz and the frequency of "1.0" GHz means 100% frequency (processing performance) as illustrated in FIG. 3B. This means that the arithmetic processing device 101 needs the voltage V1 of "1.10" V for the operation with a clock signal CK having the frequency of "1.0" GHz.

The speed level of "0" is associated with a frequency identifier "11" and a voltage identifier "28." The frequency identifier "11" corresponds, for example, to a frequency parameter of "1.2" GHz as illustrated in FIG. 2A. The voltage identifier "28" corresponds, for example, to a voltage parameter of "1.60" V as illustrated in FIG. 2B. As described above, the speed level of "0" means the frequency of "1.2" GHz and the frequency of "1.2" GHz means 120% frequency (processing performance) as illustrated in FIG. 3B. This means that the arithmetic processing device 101 needs the voltage V1 of "1.60" V for the operation with a clock signal CK having the frequency of "1.2" GHz.

The speed level of "2" is associated with a frequency identifier "5" and a voltage identifier "15." The frequency identifier "5" corresponds, for example, to a frequency parameter of "0.6" GHz as illustrated in FIG. 2A. The voltage identifier "15" corresponds, for example, to a voltage parameter of "0.95" V as illustrated in FIG. 2B. As described above, the speed level of "2" means the frequency of "0.6" GHz and the frequency of "0.6" GHz means 60% frequency (processing performance) as illustrated in FIG. 3B. This means that the arithmetic processing device 101 needs the voltage V1 of "0.95" V for the operation with a clock signal CK having the frequency of "0.6" GHz.

The speed level of "3" is associated with a frequency identifier "1" and a voltage identifier "2." The frequency identifier "1" corresponds, for example, to a frequency parameter of "0.2" GHz as illustrated in FIG. 2A. The voltage identifier "2" corresponds, for example, to a voltage parameter of "0.30" V as illustrated in FIG. 2B. As described above, the speed level of "3" means the frequency of "0.2" GHz and the frequency of "0.2" GHz means 20% frequency (processing performance) as illustrated in FIG. 3B. This means that the arithmetic processing device 101 needs the voltage V1 of "0.30" V for the operation with a clock signal CK having the frequency of "0.2" GHz.

As described above, as the speed level is increased, the frequency also increases in the speed level table 114. For the operation with a clock signal CK having the frequency, an appropriate minimum voltage needed by the semiconductor circuit is set by the speed level table 114 in terms of the reduction in power consumption.

FIG. 4B is a diagram illustrating an example of the speed level table 114 of an arithmetic processing device 101 different from the arithmetic processing device 101 in FIG. 4A. The arithmetic processing device 101 in FIG. 4B is of the same kind as that of the arithmetic processing device 101 in FIG. 4A. Therefore, the speed level table 114 in FIG. 4B is the same in speed level and frequency identifier as but different in voltage identifier from the speed level table 114 in FIG. 4A. For the operation with a clock signal CK having each frequency, an appropriate voltage is different for each individual chip of the arithmetic processing device 101. Therefore, even for the same kind of arithmetic processing device 101, different voltage identifiers are stored in the speed level table 114 for each arithmetic processing device 101 because of the individual difference between chips.

FIG. 4C is a diagram illustrating an example of the speed level table 114 of an arithmetic processing device 101 further different from the arithmetic processing devices 101 in FIG. 4A and FIG. 4B. The arithmetic processing device 101 in FIG. 4C is a higher performance arithmetic processing device in the next generation with respect to the arithmetic processing devices 101 in FIG. 4A and FIG. 4B. Therefore, the setting value of the standard frequency (speed level "1") during system operation is higher in the speed level table 114 in FIG. 4C than in the speed level tables 114 in FIG. 4A and FIG. 4B, and the correspondence between the frequency identifier and the voltage identifier in the whole speed level table is therefore different. Because of the arithmetic processing device in the next generation, the voltage necessary for the frequency is also different due to the manufacturing rule, manufacturing process, and so on. As a result, the speed level table 114, even at the same speed level, is different in frequency identifier and voltage identifier.

In FIG. 1, the nonvolatile memory 115 is, for example, a ROM (Read Only Memory) or a FLASH memory, and stores the speed level tables 114 illustrated in FIGS. 4A to 4C. Tuning on the power of the arithmetic processing device 101, the stored content of the speed level table 114 is initialized to the content in the speed level table stored in the nonvolatile memory 115 by the initialization processing. The nonvolatile memory 115 stores a speed level table different for each arithmetic processing device 101, thereby making it possible to initialize the speed level table 114 to the stored content suitable for each arithmetic processing device 101. This makes it possible to initialize the speed level table 114 for the individual voltage of the arithmetic processing device 101 obtained by the test result and easily change the relationship between the frequency and the voltage to each speed level. Further, the nonvolatile memory 115 stores therein the flags in the frequency table 124 in FIG. 2A, and the flags in the frequency table 124 are initialized to the flags in the frequency table stored in the nonvolatile memory 115 by the initialization processing.

The control unit 118 has a state machine and controls state transition by the state machine. The details of the state machine of the control unit 118 will be explained later with reference to FIG. 5. Referring again to FIG. 1, the comparator 117 compares the speed level stored in the request level register 111 with the speed level stored in the current level register 113 and outputs the comparison result to the control unit 118. More specifically, when the execution unit 104 writes the speed level into the request level register 111 and the speed level in the request level register 111 thereby becomes a level different from the speed level in the current level register 113, the control unit 118 starts control of the frequency parameter and the voltage parameter. Into the target level register 112, the speed level stored in the request level register 111 is written.

The speed level selector 116 selects the frequency identifier and the voltage identifier in the speed level table 114 corresponding to the speed level stored in the target level register 112 and outputs them to the frequency comparator 119 and the voltage comparator 120 respectively.

The frequency counter 122 counts the value of the frequency identifier up to the frequency identifier in the speed level table 114 corresponding to the target speed level by control of the determination unit 121. The voltage counter 123 counts the value of the voltage identifier up to the voltage identifier in the speed level table 114 corresponding to the target speed level by control of the determination unit 121.

The frequency comparator 119 outputs an up signal UP to the determination unit 121 when the frequency identifier counted by the frequency counter 122 is smaller than the frequency identifier output from the speed level selector 116, and outputs a down signal DN to the determination unit 121 when the frequency identifier counted by the frequency counter 122 is larger than the frequency identifier output from the speed level selector 116.

The voltage comparator 120 outputs an up signal UP to the determination unit 121 when the voltage identifier counted by the voltage counter 123 is smaller than the voltage identifier output from the speed level selector 116, and outputs a down signal DN to the determination unit 121 when the voltage identifier counted by the voltage counter 123 is larger than the voltage identifier output from the speed level selector 116.

The determination unit 121 outputs an increment signal INC or a decrement signal DEC to the frequency counter 122 or the voltage counter 123 according to the above-described up signal Up and down signal DN. The details will be explained later with reference to FIG. 6. The frequency counter 122 increments the frequency identifier when receiving input of the increment signal INC or decrements the frequency identifier when receiving input of the decrement signal DEC. The voltage counter 123 increments the voltage identifier when receiving input of the increment signal INC or decrements the voltage identifier when receiving input of the decrement signal DEC.

The voltage selector 127 selects the voltage parameter in the voltage table 126 corresponding to the voltage identifier counted by the voltage counter 123 and outputs the selected voltage parameter to the voltage regulator 103. The voltage regulator 103 receives input of the voltage parameter output from the voltage selector 127, generates a voltage V1 having a magnitude corresponding to the input voltage parameter, and outputs the voltage V1 to the execution unit 104.

The flag selector 128 selects the flag in the frequency table 124 corresponding to the frequency identifier counted by the frequency counter 122 and outputs the flag to the control unit 118 via the flag check unit 129.

The frequency selector 125 selects the frequency parameter in the frequency table 124 corresponding to the frequency identifier counted by the frequency counter 122 and outputs the selected frequency parameter to the phase locked loop circuit 102 when the flag input into the flag check unit 129 is "1" under control of the control unit 118. The phase locked loop circuit 102 receives input of the frequency parameter output from the frequency selector 125, generates a clock signal CK having a frequency according to the input frequency parameter, and outputs the clock signal CK to the execution unit 104.

Figures 5, 6:
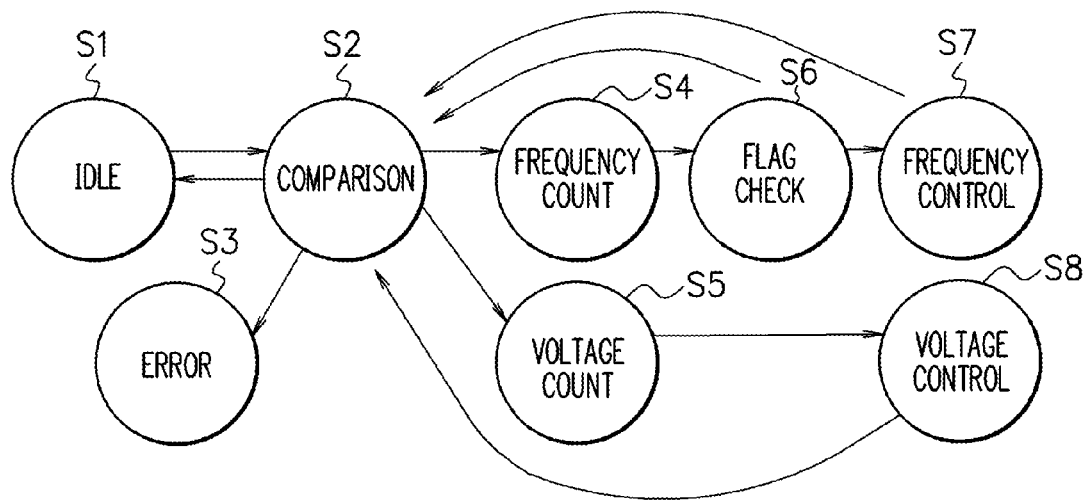
FIG. 5 is a diagram illustrating state transition controlled by a control unit.
FIG. 6 is a diagram for explaining transition from a comparison state to a next state.

FIG. 5 is a diagram illustrating the state transition controlled by the control unit 118 in FIG. 1. The state transition by the control unit 118 can be divided into an idle state S1 and control states other than the idle state S1. At the initial time, the state is the idle state S1. When the execution unit 104 writes the speed level into the request level register 111 and the comparator 117 outputs the fact that the speed level in the request level register 111 is different from the speed level in the current level register 113 to the control unit 118, the control unit 118 transits the state from the idle state S1 to a comparison state S2. From the comparison state S2, the state transits to the idle state S1, an error state S3, a frequency count state S4, or a voltage count state S5. The details will be explained with reference to FIG. 6.

FIG. 6 is a diagram for explaining transition from the comparison state S2 to the next state in FIG. 5. In the comparison state S2, the frequency comparator 119 and the voltage comparator 120 perform comparison. The frequency comparator 119 outputs an up signal UP of "0" and a down signal DN of "0" when the frequency identifier counted by the frequency counter 122 is the same as the frequency identifier output from the speed level selector 116. Further, the frequency comparator 119 outputs an up signal UP of "1" and a down signal DN of "0" when the frequency identifier counted by the frequency counter 122 is smaller than the frequency identifier output from the speed level selector 116. Further, the frequency comparator 119 outputs an up signal UP of "0" and a down signal DN of "1" when the frequency identifier counted by the frequency counter 122 is larger than the frequency identifier output from the speed level selector 116.

The voltage comparator 120 outputs an up signal UP of "0" and a down signal DN of "0" when the voltage identifier counted by the voltage counter 123 is the same as the voltage identifier output from the speed level selector 116. Further, the voltage comparator 120 outputs an up signal UP of "1" and a down signal DN of "0" when the voltage identifier counted by the voltage counter 123 is smaller than the voltage identifier output from the speed level selector 116. Further, the voltage comparator 120 outputs an up signal UP of "0" and a down signal DN of "1" when the voltage identifier counted by the voltage counter 123 is larger than the voltage identifier output from the speed level selector 116.

The determination unit 121 instructs the control unit 118 to perform transition to the next state according to the up signal UP and the down signal DN of the frequency comparator 119 and the up signal UP and the down signal DN of the voltage comparator 120.

When of the frequency comparator 119, the up signal UP is "0" and the down signal DN is "0" and of the voltage comparator 120, the up signal UP is "0" and the down signal DN is "0," the control is finished, and since the target speed level is reached, the state transits from the comparison state S2 to the idle state S1. In the idle state S1, the speed level stored in the target level register 112 is written into the current level register 113.

When of the frequency comparator 119, the up signal UP is "0" and the down signal DN is "0" and of the voltage comparator 120, the up signal UP is "0" and the down signal DN is "1," to decrease the voltage by one step, the state transits from the comparison state S2 to the voltage count state S5. The determination unit 121 outputs a decrement signal DEC to the voltage counter 123 and the voltage counter 123 decrements the voltage identifier.

When of the frequency comparator 119, the up signal UP is "0" and the down signal DN is "0" and of the voltage comparator 120, the up signal UP is "1" and the down signal DN is "0," to increase the voltage by one step, the state transits from the comparison state S2 to the voltage count state S5. The determination unit 121 outputs an increment signal INC to the voltage counter 123 and the voltage counter 123 increments the voltage identifier.

When of the frequency comparator 119, the up signal UP is "0" and the down signal DN is "0" and of the voltage comparator 120, the up signal UP is "1" and the down signal DN is "1," the state is contradictory, and the state transits from the comparison state S2 to the error state S3.

When of the frequency comparator 119, the up signal UP is "0" and the down signal DN is "1" and of the voltage comparator 120, the up signal UP is "0" and the down signal DN is "0," to decrease the frequency by one step, the state transits from the comparison state S2 to the frequency count state S4. The determination unit 121 outputs a decrement signal DEC to the frequency counter 122 and the frequency counter 122 decrements the frequency identifier.

When of the frequency comparator 119, the up signal UP is "0" and the down signal DN is "1" and of the voltage comparator 120, the up signal UP is "0" and the down signal DN is "1," to decrease only the frequency by one step, the state transits from the comparison state S2 to the frequency count state S4. The determination unit 121 outputs a decrement signal DEC to the frequency counter 122 and the frequency counter 122 decrements the frequency identifier.

When of the frequency comparator 119, the up signal UP is "0" and the down signal DN is "1" and of the voltage comparator 120, the up signal UP is "1" and the down signal DN is "0," the state is contradictory, and the state transits from the comparison state S2 to the error state S3.

When of the frequency comparator 119, the up signal UP of is "0" and the down signal DN is "1" and of the voltage comparator 120, the up signal UP is "1" and the down signal DN is "1," the state is contradictory, and the state transits from the comparison state S2 to the error state S3.

When of the frequency comparator 119, the up signal UP is "1" and the down signal DN is "0" and of the voltage comparator 120, the up signal UP is "0" and the down signal DN is "0," to increase the frequency by one step, the state transits from the comparison state S2 to the frequency count state S4. The determination unit 121 outputs an increment signal INC to the frequency counter 122 and the frequency counter 122 increments the frequency identifier.

When of the frequency comparator 119, the up signal UP is "1" and the down signal DN is "0" and of the voltage comparator 120, the up signal UP is "0" and the down signal DN is "1," the state is contradictory, and the state transits from the comparison state S2 to the error state S3.

When of the frequency comparator 119, the up signal UP is "1" and the down signal DN is "0" and of the voltage comparator 120, the up signal UP is "1" and the down signal DN is "0," to increase the voltage by one step, the state transits from the comparison state S2 to the voltage count state S5. The determination unit 121 outputs an increment signal INC to the voltage counter 123 and the voltage counter 123 increments the voltage identifier.

When of the frequency comparator 119, the up signal UP is "1" and the down signal DN is "0" and of the voltage comparator 120, the up signal UP is "1" and the down signal DN is "1," the state is contradictory, and the state transits from the comparison state S2 to the error state S3.

When of the frequency comparator 119, the up signal UP is "1" and the down signal DN is "1" and of the voltage comparator 120, the up signal UP is "0" and the down signal DN is "0," the state is contradictory, and the state transits from the comparison state S2 to the error state S3.

When of the frequency comparator 119, the up signal UP is "1" and the down signal DN is "1" and of the voltage comparator 120, the up signal UP is "0" and the down signal DN is "1," the state is contradictory, and the state transits from the comparison state S2 to the error state S3.

When of the frequency comparator 119, the up signal UP is "1" and the down signal DN is "1" and of the voltage comparator 120, the up signal UP is "1" and the down signal DN is "0," the state is contradictory, and the state transits from the comparison state S2 to the error state S3.

When of the frequency comparator 119, the up signal UP is "1" and the down signal DN is "1" and of the voltage comparator 120, the up signal UP is "1" and the down signal DN is "1," the state is contradictory, and the state transits from the comparison state S2 to the error state S3.

In FIG. 5, in the error state S3, because of occurrence of error in hardware, information "1" indicating that there is an error is written as the error information 301 into the request level register 111 in FIG. 3A. The execution unit 104 can recognize that an error has occurred in the control circuit by confirming the content of the error information 301 written into the request level register 111.

In the voltage count state S5, the state subsequently transits to the voltage control state S8. In the voltage control state S8, the voltage selector 127 selects the voltage parameter in the voltage table 126 corresponding to the voltage identifier counted by the voltage counter 123 and outputs the selected voltage parameter to the voltage regulator 103. The voltage regulator 103 generates a voltage V1 having a magnitude according to the input voltage parameter. After completion of the control of the voltage control state S8, the state returns to the above-described comparison state S2.

In the frequency count state S4, the state subsequently transits to the flag check state S6. In the flag check state S6, the flag selector 128 selects the flag in the frequency table 124 corresponding to the frequency identifier counted by the frequency counter 122 and outputs the selected flag to the control unit 118 via the flag check unit 129. When the control unit 118 receives input of the flag "0," the state returns to the comparison state S2 from the flag check state S6. When the control unit 118 receives input of the flag "1," the state transits from the flag check state S6 to the frequency control state S7.

In the frequency control state S7, the frequency selector 125 selects the frequency parameter in the frequency table 124 corresponding to the frequency identifier counted by the frequency counter 122 and outputs the selected frequency parameter to the phase locked loop circuit 102. The phase locked loop circuit 102 generates a clock signal CK having a frequency according to the input frequency parameter. After completion of the control of the frequency control state S7, the state returns to the above-described comparison state S2.

Figure 7:
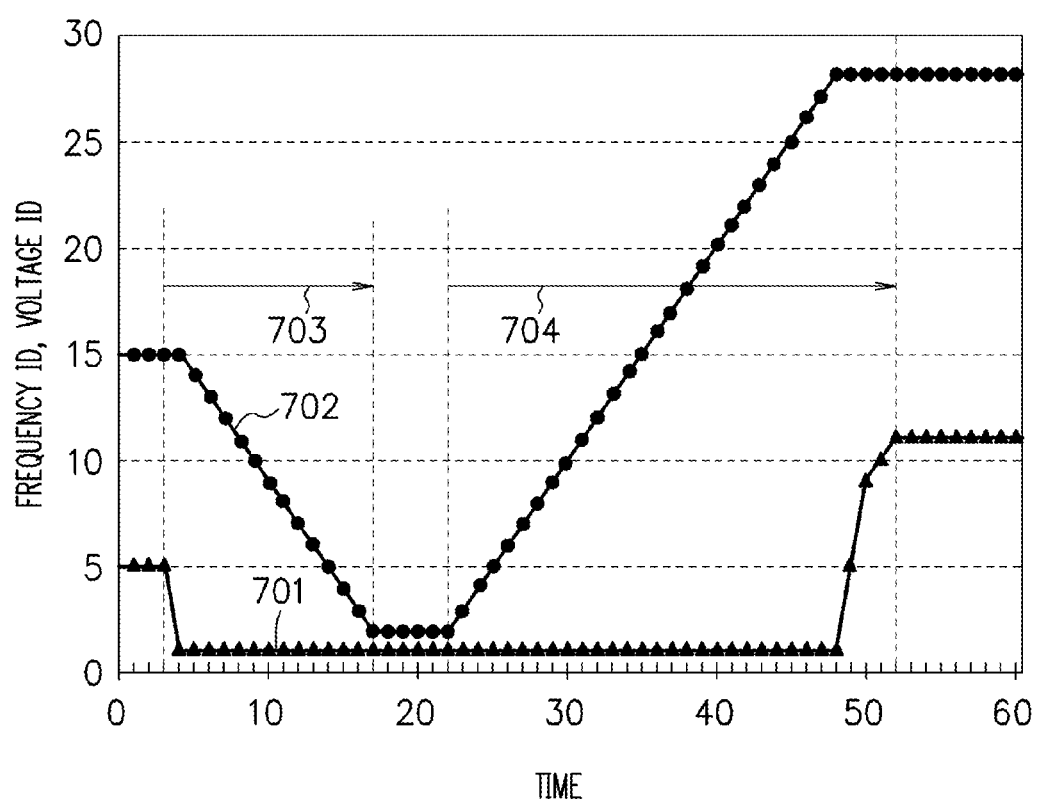
FIG. 7 is a time chart illustrating a control example of an arithmetic processing device.

FIG. 7 is a time chart illustrating a control example of the arithmetic processing device 101 in FIG. 1. A frequency identifier 701 indicates the change of the frequency identifier with passage of time. A voltage identifier 702 indicates the change of the voltage identifier with passage of time. An example in which the frequency table 124 stores the content of FIG. 2A, the voltage table 126 stores the content of FIG. 2B, and the speed level table 114 stores the content of FIG. 4A will be explained.

At time "1," the request level register 111, the target level register 112, and the current level register 113 are set to the speed level of "2." As illustrated in FIG. 4A, the speed level of "2" corresponds to the frequency identifier "5" and the voltage identifier "15." Therefore, the frequency identifier 701 being the count value of the frequency counter 122 is "5" and the voltage identifier 702 being the count value of the voltage counter 123 is "15." The phase locked loop circuit 102 receives input of the frequency parameter corresponding to the frequency identifier "5" and generates a clock signal CK having a frequency of "0.6" GHz as illustrated in FIG. 2A. The voltage regulator 103 receives input of the voltage parameter corresponding to the voltage identifier "15" and generates a voltage V1 of "0.95" V as illustrated in FIG. 2B.

Next, at time "3", the execution unit 104 writes the speed level of "3" into the request level register 111. Then, the speed level of "3" is written into the target level register 112. More specifically, in a state where the speed level stored in the request level register 111 and the speed level stored in the current level register 113 are the same, when a speed level different from the speed level stored in the current level register 113 is written into the request level register 111, the speed level written into the request level register 111 is written into the target level register 112 as the target speed level.

Hereinafter, control of changing from the speed level of "2" to the speed level of "3" is performed. The speed level selector 116 refers to the speed level table 114 in FIG. 4A, selects the frequency identifier "1" and the voltage identifier "2" corresponding to the speed level of "3," and outputs them to the frequency comparator 119 and the voltage comparator 120 respectively. The frequency comparator 119 compares the frequency identifier "5" output from the frequency counter 122 with the frequency identifier "1" output from the speed level selector 116 and outputs an up signal UP of "0" and a down signal DN of "1" to the determination unit 121. The voltage comparator 120 compares the voltage identifier "15" output from the voltage counter 123 with the voltage identifier "2" output from the speed level selector 116 and outputs an up signal UP of "0" and a down signal DN of "1" to the determination unit 121. The determination unit 121 outputs a decrement signal DEC to the frequency counter 122 as illustrated in FIG. 6.

Next, the frequency counter 122 decrements the frequency identifier 701 from "5" to "4." The flag selector 128 outputs the flag "0" corresponding to the frequency identifier 701 of "4." Since the flag is "0," the state returns to the comparison state S2. The frequency comparator 119 compares the frequency identifier "4" output from the frequency counter 122 with the frequency identifier "1" output from the speed level selector 116 and outputs an up signal UP of "0" and a down signal DN of "1" to the determination unit 121. The voltage comparator 120 compares the voltage identifier "15" output from the voltage counter 123 with the voltage identifier "2" output from the speed level selector 116 and outputs an up signal UP of "0" and a down signal DN of "1" to the determination unit 121. The determination unit 121 outputs a decrement signal DEC to the frequency counter 122 as illustrated in FIG. 6. Next, the frequency counter 122 decrements the frequency identifier 701 from "4" to "3." The flag selector 128 outputs the flag "0" corresponding to the frequency identifier 701 of "3." Since the flag is "0," the state returns to the comparison state S2. By performing the same processing as the above repeatedly, the frequency identifier 701 is decremented sequentially and the frequency identifier 701 becomes "1."

Next, at time "4," the flag selector 128 outputs the flag "1" corresponding to the frequency identifier 701 of "1." Since the flag is "1," the frequency selector 125 outputs the frequency parameter corresponding to the frequency identifier 701 of "1" to the phase locked loop circuit 102. The phase locked loop circuit 102 receives input of the frequency parameter corresponding to the frequency identifier "1" and generates a clock signal CK having a frequency of "0.2" GHz as illustrated in FIG. 2A. The clock signal CK changes to the frequency of the frequency identifier 701 of "1" from the frequency of the frequency identifier 701 of "5" as a result.

Next, the frequency comparator 119 compares the frequency identifier "1" output from the frequency counter 122 with the frequency identifier "1" output from the speed level selector 116 and outputs an up signal UP of "0" and a down signal DN of "0" to the determination unit 121. The voltage comparator 120 compares the voltage identifier "15" output from the voltage counter 123 with the voltage identifier "2" output from the speed level selector 116 and outputs an up signal UP of "0" and a down signal DN of "1" to the determination unit 121. The determination unit 121 outputs a decrement signal DEC to the voltage counter 123 as illustrated in FIG. 6.

Next, at time "5", the voltage counter 123 decrements the voltage identifier 702 from "15" to "14." The voltage regulator 103 receives input of the voltage parameter corresponding to the voltage identifier "14" and generates a voltage V1 of "0.90" V as illustrated in FIG. 2B.

Next, the frequency comparator 119 compares the frequency identifier "1" output from the frequency counter 122 with the frequency identifier "1" output from the speed level selector 116 and outputs an up signal UP of "0" and a down signal DN of "0" to the determination unit 121. The voltage comparator 120 compares the voltage identifier "14" output from the voltage counter 123 with the voltage identifier "2" output from the speed level selector 116 and outputs an up signal UP of "0" and a down signal DN of "1" to the determination unit 121. The determination unit 121 outputs a decrement signal DEC to the voltage counter 123 as illustrated in FIG. 6.

Next, at time "6," the voltage counter 123 decrements the voltage identifier 702 from "14" to "13." The voltage regulator 103 receives input of the voltage parameter corresponding to the voltage identifier "13" and generate a voltage V1 of "0.85" V as illustrated in FIG. 2B.

By repeating the same processing as the above, the voltage identifier 702 is sequentially decremented. At time "17", the frequency identifier 701 of the frequency counter 122 becomes "1" and the voltage identifier 702 of the voltage counter 123 becomes "2." The voltage regulator 103 receives input of the voltage parameter corresponding to the voltage identifier "2" and generates a voltage V1 of "0.30" V as illustrated in FIG. 2B.

Next, the frequency comparator 119 compares the frequency identifier "1" output from the frequency counter 122 with the frequency identifier "1" output from the speed level selector 116 and outputs an up signal UP of "0" and a down signal DN of "0" to the determination unit 121. The voltage comparator 120 compares the voltage identifier "2" output from the voltage counter 123 with the voltage identifier "2" output from the speed level selector 116 and outputs an up signal UP of "0" and a down signal DN of "0" to the determination unit 121. The determination unit 121 transits to the idle state S1 as illustrated in FIG. 6. In the idle state S1, the speed level of "3" is written into the current level register 113.

With the above, the control of changing from the speed level of "2" to the speed level of "3" is completed. For decreasing the speed level from "2" to "3," only the frequency is first decreased from 0.6 GHz down to 0.2 GHz by the frequency identifier 701 as described above. Thereafter, only the voltage is decreased stepwise by 0.05 V from 0.95 V down to 0.30 V by the voltage identifier 702. As described above, to decrease the speed level, it is necessary to first decrease the frequency by the frequency identifier 701 to create a state in which the voltage can be decreased, and then to decrease the voltage by the voltage identifier 702.

More specifically, as illustrated in FIG. 6, when the frequency comparator 119 outputs the comparison result that the frequency of the frequency identifier 701 counted by the frequency counter 122 is higher than the frequency of the frequency identifier output from the speed level selector 116 and the voltage comparator 120 outputs the comparison result that the voltage of the voltage identifier 702 counted by the voltage counter 123 is higher than the voltage of the voltage identifier output from the speed level selector 116, the frequency counter 122 counts the frequency identifier 701 in a direction in which the frequency decreases and the voltage counter 123 stops the count of the voltage identifier 702.

Further, when the frequency comparator 119 outputs the comparison result that the frequency identifier 701 counted by the frequency counter 122 is the same as the frequency identifier output from the speed level selector 116 and the voltage comparator 120 outputs the comparison result that the voltage of the voltage identifier 702 counted by the voltage counter 123 is higher than the voltage of the voltage identifier output from the speed level selector 116, the frequency counter 122 stops the count of the frequency identifier 701 and the voltage counter 123 counts the voltage identifier 702 in a direction in which the voltage decreases.

Further, when the frequency comparator 119 outputs the comparison result that the frequency identifier 701 counted by the frequency counter 122 is the same as the frequency identifier output from the speed level selector 116 and the voltage comparator 120 outputs the comparison result that the voltage identifier 702 counted by the voltage counter 123 is the same as the voltage identifier output from the speed level selector 116, the frequency counter 122 stops the count of the frequency identifier 701, and the voltage counter 123 stops the count of the voltage identifier 702.

Next, control of increasing from the speed level of "3" to the speed level of "0" will be explained. At time "22", the execution unit 104 writes the speed level of "0" into the request level register 111. Then, the speed level of "0" is written into the target level register 112. The speed level selector 116 refers to the speed level table 114 in FIG. 4A, selects the frequency identifier "11" and the voltage identifier "28" corresponding to the speed level of "0," and outputs them to the frequency comparator 119 and the voltage comparator 120 respectively. The frequency comparator 119 compares the frequency identifier "1" output from the frequency counter 122 with the frequency identifier "11" output from the speed level selector 116 and outputs an up signal UP of "1" and a down signal DN of "0" to the determination unit 121. The voltage comparator 120 compares the voltage identifier "2" output from the voltage counter 123 with the voltage identifier "28" output from the speed level selector 116 and outputs an up signal UP of "1" and a down signal DN of "0" to the determination unit 121. The determination unit 121 outputs an increment signal INC to the voltage counter 123 as illustrated in FIG. 6.

Next, at time "23", the voltage counter 123 increments the voltage identifier 702 from "2" to "3." The voltage regulator 103 receives input of the voltage parameter corresponding to the voltage identifier "3" and generates a voltage V1 of "0.35" V as illustrated in FIG. 2B.

Next, the frequency comparator 119 compares the frequency identifier "1" output from the frequency counter 122 with the frequency identifier "11" output from the speed level selector 116 and outputs an up signal UP of "1" and a down signal DN of "0" to the determination unit 121. The voltage comparator 120 compares the voltage identifier "3" output from the voltage counter 123 with the voltage identifier "28" output from the speed level selector 116 and outputs an up signal UP of "1" and a down signal DN of "0" to the determination unit 121. The determination unit 121 outputs an increment signal INC to the voltage counter 123 as illustrated in FIG. 6.

Next, at time "24", the voltage counter 123 increments the voltage identifier 702 from "3" to "4." The voltage regulator 103 receives input of the voltage parameter corresponding to the voltage identifier "4" and generates a voltage V1 of "0.40" V as illustrated in FIG. 2B.

By repeating the same processing as the above, the voltage identifier 702 is sequentially incremented. At time "48", the frequency identifier 701 of the frequency counter 122 becomes "1" and the voltage identifier 702 of the voltage counter 123 becomes "28." The voltage regulator 103 receives input of the voltage parameter corresponding to the voltage identifier "28" and generates a voltage V1 of "1.60" V as illustrated in FIG. 2B.

Next, the frequency comparator 119 compares the frequency identifier "1" output from the frequency counter 122 with the frequency identifier "11" output from the speed level selector 116 and outputs an up signal UP of "1" and a down signal DN of "0" to the determination unit 121. The voltage comparator 120 compares the voltage identifier "28" output from the voltage counter 123 with the voltage identifier "28" output from the speed level selector 116 and outputs an up signal UP of "0" and a down signal DN of "0" to the determination unit 121. The determination unit 121 outputs an increment signal INC to the frequency counter 122 as illustrated in FIG. 6.

Next, the frequency counter 122 increments the frequency identifier 701 from "1" to "2." The flag selector 128 outputs the flag "0" corresponding to the frequency identifier 701 of "2." Since the flag is "0," the state returns to the comparison state S2. The frequency comparator 119 compares the frequency identifier "2" output from the frequency counter 122 with the frequency identifier "11" output from the speed level selector 116 and outputs an up signal UP of "1" and a down signal DN of "0" to the determination unit 121. The voltage comparator 120 compares the voltage identifier "28" output from the voltage counter 123 with the voltage identifier "28" output from the speed level selector 116 and outputs an up signal UP of "0" and a down signal DN of "0" to the determination unit 121. The determination unit 121 outputs an increment signal INC to the frequency counter 122 as illustrated in FIG. 6. Next, the frequency counter 122 increments the frequency identifier 701 from "2" to "3." The flag selector 128 outputs the flag "0" corresponding to the frequency identifier 701 of "3." Since the flag is "0," the state returns to the comparison state S2. By repeating the same processing as the above, the frequency identifier 701 is incremented sequentially and the frequency identifier 701 becomes "5."

Next, at time "49," the flag selector 128 outputs the flag "1" corresponding to the frequency identifier 701 of "5." Since the flag is "1," the frequency selector 125 outputs the frequency parameter corresponding to the frequency identifier 701 of "5" to the phase locked loop circuit 102. The phase locked loop circuit 102 receives input of the frequency parameter corresponding to the frequency identifier "5" and generates a clock signal CK having a frequency of "0.6" GHz as illustrated in FIG. 2A. The clock signal CK changes to the frequency of the frequency identifier 701 of "5" from the frequency of the frequency identifier 701 of "1" as a result.

Next, the frequency comparator 119 compares the frequency identifier "5" output from the frequency counter 122 with the frequency identifier "11" output from the speed level selector 116 and outputs an up signal UP of "1" and a down signal DN of "0" to the determination unit 121. The voltage comparator 120 compares the voltage identifier "28" output from the voltage counter 123 with the voltage identifier "28" output from the speed level selector 116 and outputs an up signal UP of "0" and a down signal DN of "0" to the determination unit 121. The determination unit 121 outputs an increment signal INC to the frequency counter 122 as illustrated in FIG. 6.

Next, the frequency counter 122 increments the frequency identifier 701 from "5" to "6." The flag selector 128 outputs the flag "0" corresponding to the frequency identifier 701 of "6." Since the flag is "0," the state returns to the comparison state S2. The frequency comparator 119 compares the frequency identifier "6" output from the frequency counter 122 with the frequency identifier "11" output from the speed level selector 116 and outputs an up signal UP of "1" and a down signal DN of "0" to the determination unit 121. The voltage comparator 120 compares the voltage identifier "28" output from the voltage counter 123 with the voltage identifier "28" output from the speed level selector 116 and outputs an up signal UP of "0" and a down signal DN of "0" to the determination unit 121. The determination unit 121 outputs an increment signal INC to the frequency counter 122 as illustrated in FIG. 6. Next, the frequency counter 122 increments the frequency identifier 701 from "6" to "7." The flag selector 128 outputs the flag "0" corresponding to the frequency identifier 701 of "7." Since the flag is "0," the state returns to the comparison state S2. By repeating the same processing as the above, the frequency identifier 701 is sequentially incremented and the frequency identifier 701 becomes "9."

Next, at time "50," the flag selector 128 outputs the flag "1" corresponding to the frequency identifier 701 of "9." Since the flag is "1," the frequency selector 125 outputs the frequency parameter corresponding to the frequency identifier 701 of "9" to the phase locked loop circuit 102. The phase locked loop circuit 102 receives input of the frequency parameter corresponding to the frequency identifier "9" and generates a clock signal CK having a frequency of "1.0" GHz as illustrated in FIG. 2A. The clock signal CK changes to the frequency of the frequency identifier 701 of "9" from the frequency of the frequency identifier 701 of "5" as a result.

Next, the frequency comparator 119 compares the frequency identifier "9" output from the frequency counter 122 with the frequency identifier "11" output from the speed level selector 116 and outputs an up signal UP of "1" and a down signal DN of "0" to the determination unit 121. The voltage comparator 120 compares the voltage identifier "28" output from the voltage counter 123 with the voltage identifier "28" output from the speed level selector 116 and outputs an up signal UP of "0" and a down signal DN of "0" to the determination unit 121. The determination unit 121 outputs an increment signal INC to the frequency counter 122 as illustrated in FIG. 6.

Next, at time "51," the frequency counter 122 increments the frequency identifier 701 from "9" to "10." The flag selector 128 outputs the flag "1" corresponding to the frequency identifier 701 of "10." Since the flag is "1," the frequency selector 125 outputs the frequency parameter corresponding to the frequency identifier 701 of "10" to the phase locked loop circuit 102. The phase locked loop circuit 102 receives input of the frequency parameter corresponding to the frequency identifier "10" and generates a clock signal CK having a frequency of "1.1" GHz as illustrated in FIG. 2A. The clock signal CK changes to the frequency of the frequency identifier 701 of "10" from the frequency of the frequency identifier 701 of "9" as a result.

Next, the frequency comparator 119 compares the frequency identifier "10" output from the frequency counter 122 with the frequency identifier "11" output from the speed level selector 116 and outputs an up signal UP of "1" and a down signal DN of "0" to the determination unit 121. The voltage comparator 120 compares the voltage identifier "28" output from the voltage counter 123 with the voltage identifier "28" output from the speed level selector 116 and outputs an up signal UP of "0" and a down signal DN of "0" to the determination unit 121. The determination unit 121 outputs an increment signal INC to the frequency counter 122 as illustrated in FIG. 6.

Next, at time "52", the frequency counter 122 increments the frequency identifier 701 from "10" to "11." The flag selector 128 outputs the flag "1" corresponding to the frequency identifier 701 of "11." Since the flag is "1," the frequency selector 125 outputs the frequency parameter corresponding to the frequency identifier 701 of "11" to the phase locked loop circuit 102. The phase locked loop circuit 102 receives input of the frequency parameter corresponding to the frequency identifier "11" and generates a clock signal CK having a frequency of "1.2" GHz as illustrated in FIG. 2A. The clock signal CK changes to the frequency of the frequency identifier 701 of "11" from the frequency of the frequency identifier 701 of "10" as a result.

Next, the frequency comparator 119 compares the frequency identifier "11" output from the frequency counter 122 with the frequency identifier "11" output from the speed level selector 116 and outputs an up signal UP of "0" and a down signal DN of "0" to the determination unit 121. The voltage comparator 120 compares the voltage identifier "28" output from the voltage counter 123 with the voltage identifier "28" output from the speed level selector 116 and outputs an up signal UP of "0" and a down signal DN of "0" to the determination unit 121. The determination unit 121 transits to the idle state S1 as illustrated in FIG. 6. In the idle state S1, the speed level of "0" is written into the current level register 113.

With the above, the control of changing from the speed level of "3" to the speed level of "0" is completed. For increasing the speed level from "3" to "0," only the voltage is increased stepwise by 0.05 V from 0.30 V up to 1.60 V by the voltage identifier 702 as described above. Thereafter, only the frequency is increased stepwise from 0.2 GHz up to 1.2 GHz by the frequency identifier 701. As described above, to increase the speed level, it is necessary to first increase the voltage by the voltage identifier 702 to create a state in which the frequency can be increased, and then to increase the frequency by the frequency identifier 701.

More specifically, as illustrated in FIG. 6, when the frequency comparator 119 outputs the comparison result that the frequency of the frequency identifier 701 counted by the frequency counter 122 is lower than the frequency of the frequency identifier output from the speed level selector 116 and the voltage comparator 120 outputs the comparison result that the voltage of the voltage identifier 702 counted by the voltage counter 123 is lower than the voltage of the voltage identifier output from the speed level selector 116, the voltage counter 123 counts the voltage identifier 702 in a direction in which the voltage increases and the frequency counter 122 stops the count of the frequency identifier 701.

Further, when the frequency comparator 119 outputs the comparison result that the frequency of the frequency identifier 701 counted by the frequency counter 122 is lower than the frequency of the frequency identifier output from the speed level selector 116 and the voltage comparator 120 outputs the comparison result that the voltage identifier counted by the voltage counter 123 is the same as the voltage identifier output from the speed level selector 116, the frequency counter 122 counts the frequency identifier 701 in a direction in which the frequency increases and the voltage counter 123 stops the count of the voltage identifier 702.

Further, when the frequency comparator 119 outputs the comparison result that the frequency identifier 701 counted by the frequency counter 122 is the same as the frequency identifier output from the speed level selector 116 and the voltage comparator 120 outputs the comparison result that the voltage identifier 702 counted by the voltage counter 123 is the same as the voltage identifier output from the speed level selector 116, the frequency counter 122 stops the count of the frequency identifier 701 and the voltage counter 123 stops the count of the voltage identifier 702.

According to this embodiment, even when the kind and the value of the frequency parameter and the kind and the value of the voltage parameter are different for each arithmetic processing device 101, the arithmetic processing device 101 can be coped with by changing the contents of the frequency table 124 and the voltage table 126 without a need to change the contents of the program for the execution unit 104 to write the speed level into the request level register 111. Therefore, the frequency parameter and the voltage parameter can be easily controlled for various arithmetic processing devices 101.

As illustrated in FIGS. 4A to 4C, when the change of the speed level is instructed so that the speed level decreases, the frequency of the clock signal CK is controlled to decrease and then the voltage V1 generated by the voltage regulator 103 is controlled to decrease. In contrast to this, when the change of the speed level is instructed so that the speed level increases, the voltage V1 generated by the voltage regulator 103 is controlled to increase and then the frequency of the clock signal CK is controlled to increase.

At times "3" to "4" described above, the frequency identifier 701 is changed in a low frequency range of the current frequency identifier 701 of "5" to the target frequency identifier 701 of "1," to therefore cause a small effect of a power supply noise. Thus, at times "3" to "4," the frequency identifier 701 is changed from "5" to "1" at once. In this case, the power supply noise hardly occurs.

Further, at times "48" to "52" described above, the frequency identifier 701 is changed stepwise from "1" to "11." On this occasion, in a first frequency range of the frequency identifier 701 of "1" to the frequency identifier 701 of "9" out of the range of the current frequency identifier 701 of "1" to the target frequency identifier 701 of "11," the frequency of the clock signal Ck is changed by a first change amount of "0.4 GHz." In contrast to this, in a second frequency range of the frequency identifier 701 of "9" to the frequency identifier 701 of "11" out of the range of the current frequency identifier 701 of "1" to the target frequency identifier 701 of "11," the frequency of the clock signal Ck is changed by a second change amount of "0.1 GHz."

The first frequency range is a low frequency range compared to the second frequency range, so that the effect of a power supply noise is small. Thus, in the first frequency range of the frequency identifier 701 of "1" to the frequency identifier 701 of "9," the frequency of the clock signal CK is changed by a large change amount of "0.4 GHz." In this case, the power supply noise hardly occurs.

The second frequency range is a high frequency range compared to the first frequency range, so that the effect of a power supply noise is large. Thus, in the second frequency range of the frequency identifier 701 of "9" to the frequency identifier 701 of "11," the frequency of the clock signal CK is changed by a small change amount of "0.1 GHz." This enables a reduction in the power supply noise.

In contrast to this, from the current voltage identifier 702 of the voltage regulator 103 to the target voltage identifier 702 of the voltage regulator 103, the voltage identifier 702 of the voltage regulator 103 changes stepwise by the same change amount.

Next, the case of decreasing the frequency identifier from "11" to "1" will be explained. At present, the phase locked loop circuit 102 generates a clock signal CK having a frequency corresponding to the frequency identifier "11." Next, since the flag corresponding to the frequency identifier "10" is "1," the phase locked loop circuit 102 generates a clock signal CK having a frequency corresponding to the frequency identifier "10." Next, since the flag corresponding to the frequency identifier "9" is "1," the phase locked loop circuit 102 generates a clock signal CK having a frequency corresponding to the frequency identifier "9." Next, since the flag corresponding to the frequency identifiers "8" to "6" is "0" and the flag corresponding to the frequency identifier "5" is "1," the phase locked loop circuit 102 generates a clock signal CK having a frequency corresponding to the frequency identifier "5." Next, since the flag corresponding to the frequency identifiers "4" to "2" is "0" and the flag corresponding to the frequency identifier "1" is "1," the phase locked loop circuit 102 generates a clock signal CK having a frequency corresponding to the frequency identifier "1."

Next, there will be explained that this embodiment in FIG. 7 can perform the change of the frequency and the speed level at high speed while comparing with FIG. 8.

Figure 8:
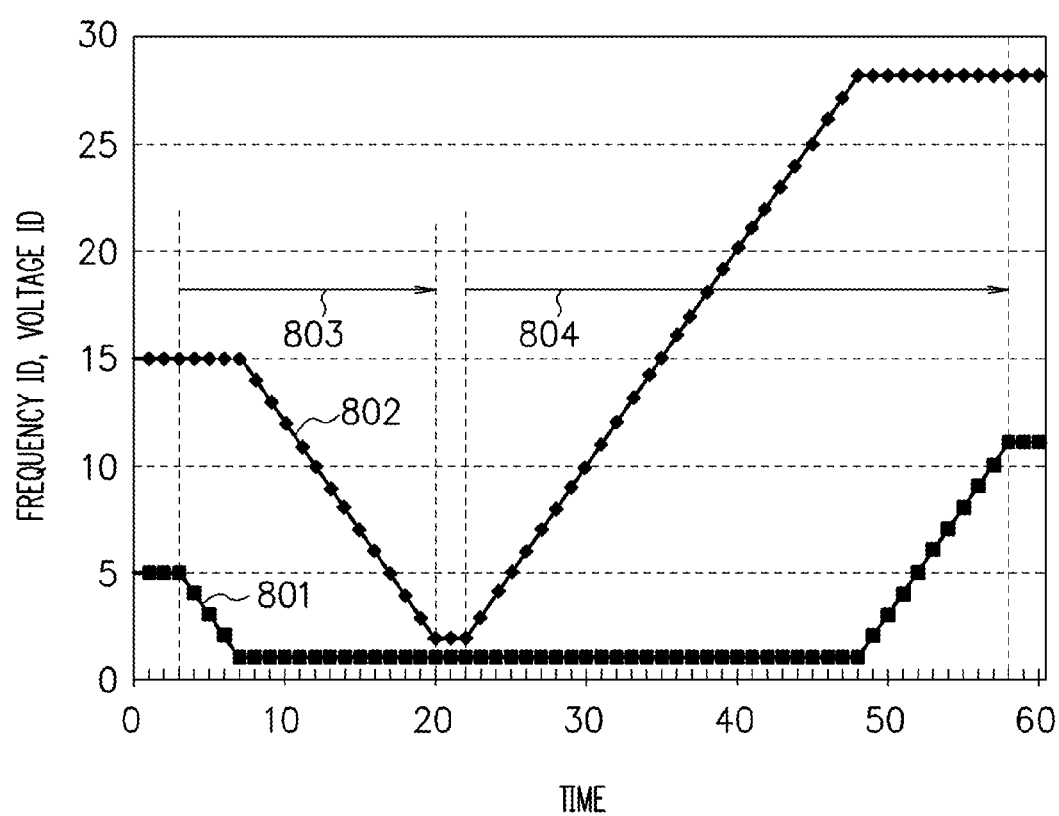
FIG. 8 is a time chart illustrating a control example of the arithmetic processing device when flags in the frequency table are all "1;"

FIG. 8 is a time chart illustrating a control example of the arithmetic processing device 101 when the flags in the frequency table 124 in FIG. 2A are all "1." At times "3" to "20," the speed level is changed from "2" to "3." First, at times "3" to "7," a frequency identifier 801 is changed by "1" from "5" to "1." Next, at times "7" to "20," a voltage identifier 802 is changed by "1" from "15" to "2." It is found out in this case that a time period 703 for changing the speed level from "2" to "3" in FIG. 7 is shorter than a time period 803 for changing the speed level from "2" to "3" in FIG. 8. That is, this embodiment in FIG. 7 can shorten the time period 703 for changing the speed level by increasing a variation amount at the time of changing the frequency identifier 701 from "5" to "1." Consequently, the time period for decreasing the speed level down to "3" can be shortened in FIG. 7, so that there is an advantage that power consumption of the arithmetic processing device 101 can be reduced early.

Further, at times "22" to "58," the speed level is changed from "3" to "0." First, at times "22" to "48," the voltage identifier 802 is changed by "1" from "2" to "28." Next, at times "48" to "58," the frequency identifier 801 is changed by "1" from "1" to "11." It is found out in this case that a time period 704 for changing the speed level from "3" to "0" in FIG. 7 is shorter than a time period 804 for changing the speed level from "3" to "0" in FIG. 8. That is, this embodiment in FIG. 7 can shorten the time period 704 for changing the speed level by making a variation amount at the time of changing the frequency identifier 701 from "1" to "9" larger than a variation amount at the time of changing the frequency identifier 701 from "9" to "11." Consequently, the time period for increasing the speed level up to "0" can be shortened in FIG. 7, so that there is an advantage that high-speed arithmetic processing of the arithmetic processing device is enabled early.

As described above, a rapid and great change in frequency of the clock signal CK in a high frequency range causes a rapid change in load, leading to a large power noise. Further, a rapid and great change in voltage makes the power supply unstable to cause unstable operation. According to this embodiment, in a high frequency range, the frequency of the clock signal CK is changed by a small variation amount of 0.1 GHz, and in a low frequency range, the frequency of the clock signal CK is changed by a large variation amount of 0.4 GHz. Further, the voltage V1 is changed stepwise by 0.05 V from the current voltage to the target voltage. This makes it possible to prevent the power supply noise, stabilize the operation, and change the speed level at high speed.

Further, the target level register 112 stores the target speed level under control at present, so that the execution unit 104 can write the next speed level into the request level register 111 without waiting for completion of the control even in the middle of control. Even if this writing has been performed, the control by the control unit 118 is continued and the request from the execution unit 104 is held in the request level register 111. After completion of the control by the control unit 118, the current level register 113 holds therein the speed level in the target level register 112, and the comparator 117 compares the speed level in the request level register 111 that has been just held with the current level register 113, and when the value of the speed level held in the request level register 111 and the value of the speed level held in the current level register 113 are different, the new speed level held in the request level register 111 is written into the target level register 112, and control for the next target speed level is started. This control is performed by the control unit 118, and therefore does not need to be performed by the execution unit 104. The execution unit 104 enables control of the frequency parameter and the voltage parameter by simple processing of writing the speed level into the request level register 111. According to this embodiment, the frequency parameter and the voltage parameter can be controlled only by giving the target speed level, so that control of the frequency parameter and the voltage parameter can be easily performed.

Second Embodiment

FIG. 9 is a diagram illustrating a configuration example of a semiconductor device according to a second embodiment. FIG. 9 is that a setting unit 901 is added to FIG. 1. Hereinafter, the points of this embodiment different from the first embodiment will be explained. The setting unit 901 changes a flag in the frequency table 124 according to a frequency identifier output from the speed level selector 116 and a frequency identifier output from the frequency counter 122. More specifically, the setting unit 901 sets a flag in the frequency table 124 according to a frequency identifier output from the speed level selector 116 and a frequency identifier output from the frequency counter 122.

Figures 10, 11:
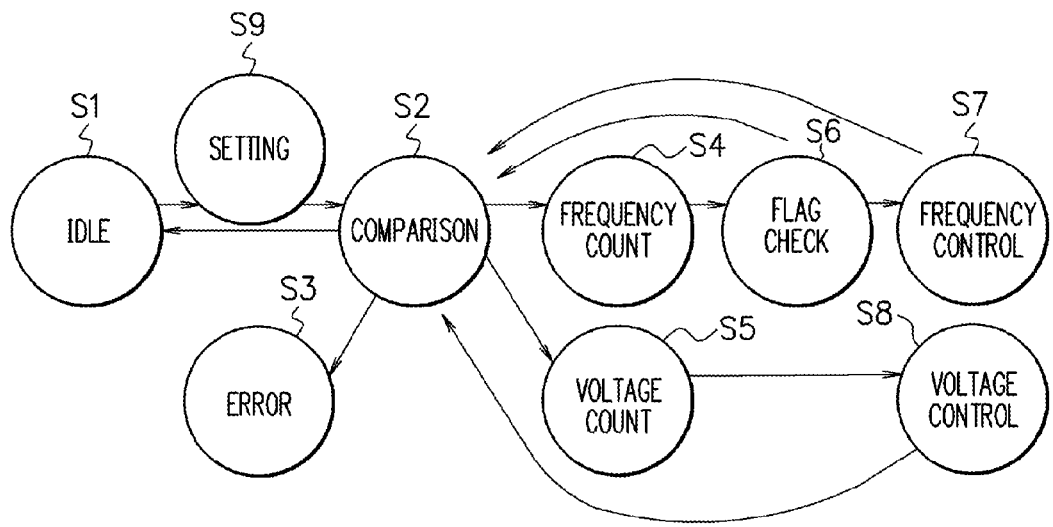
FIG. 10 a diagram illustrating state transition controlled by the control unit.
FIG. 11 is a diagram illustrating flags in the frequency table set by a setting unit.

FIG. 10 is a diagram illustrating state transition controlled by the control unit 118 in FIG. 9 according to this embodiment. FIG. 10 is that a setting state S9 is added to FIG. 5. At the initial time, the state is the idle state S1. When the execution unit 104 writes a speed level into the request level register 111 and the comparator 117 outputs the fact that the speed level in the request level register 111 is different from a speed level in the current level register 113 to the control unit 118, the control unit 118 transits the state from the idle state S1 to the setting state S9. In the setting state S9, the setting unit 901 sets a flag in the frequency table 124 according to a frequency identifier output from the speed level selector 116 and a frequency identifier output from the frequency counter 122. Thereafter, the control unit 118 transits the state from the setting state S9 to the comparison state S2.

FIG. 11 is a diagram illustrating flags in the frequency table 124 set by the setting unit 901. The setting unit 901 sets an appropriate flag in the frequency table 124 according to a current frequency identifier output from the frequency counter 122 and a target frequency identifier output from the speed level selector 116. The phase locked loop circuit 102, in the same manner as in the first embodiment, generates a clock signal CK having a frequency of the frequency identifier corresponding to the flag "1" in the frequency table 124.

First, the case when the current frequency identifier is "11" and the target frequency identifier is "9" will be explained. In this case, the phase locked loop circuit 102 is generating a clock signal CK having a frequency of the frequency identifier "11" at present. Next, the phase locked loop circuit 102 generates a clock signal CK having a frequency of the frequency identifier "10." Finally, the phase locked loop circuit 102 generates a clock signal CK having a frequency of the frequency identifier "9."

Next, the case when the current frequency identifier is "11" and the target frequency identifier is "5" will be explained. In this case, the phase locked loop circuit 102 is generating a clock signal CK having a frequency of the frequency identifier "11" at present. Next, the phase locked loop circuit 102 generates a clock signal CK having a frequency of the frequency identifier "10." Next, the phase locked loop circuit 102 generates a clock signal CK having a frequency of the frequency identifier "9." Finally, the phase locked loop circuit 102 generates a clock signal CK having a frequency of the frequency identifier "5."

Next, the case when the current frequency identifier is "11" and the target frequency identifier is "1" will be explained. In this case, the phase locked loop circuit 102 is generating a clock signal CK having a frequency of the frequency identifier "11" at present. Next, the phase locked loop circuit 102 generates a clock signal CK having a frequency of the frequency identifier "10." Next, the phase locked loop circuit 102 generates a clock signal CK having a frequency of the frequency identifier "9." Finally, the phase locked loop circuit 102 generates a clock signal CK having a frequency of the frequency identifier "1."

Next, the case when the current frequency identifier is "9" and the target frequency identifier is "11" will be explained. In this case, the phase locked loop circuit 102 is generating a clock signal CK having a frequency of the frequency identifier "9" at present. Next, the phase locked loop circuit 102 generates a clock signal CK having a frequency of the frequency identifier "10." Finally, the phase locked loop circuit 102 generates a clock signal CK having a frequency of the frequency identifier "11."

Next, the case when the current frequency identifier is "9" and the target frequency identifier is "5" will be explained. In this case, the phase locked loop circuit 102 is generating a clock signal CK having a frequency of the frequency identifier "9" at present. Next, the phase locked loop circuit 102 generates a clock signal CK having a frequency of the frequency identifier "8." Next, the phase locked loop circuit 102 generates a clock signal CK having a frequency of the frequency identifier "7." Finally, the phase locked loop circuit 102 generates a clock signal CK having a frequency of the frequency identifier "5."

Next, the case when the current frequency identifier is "9" and the target frequency identifier is "1" will be explained. In this case, the phase locked loop circuit 102 is generating a clock signal CK having a frequency of the frequency identifier "9" at present. Next, the phase locked loop circuit 102 generates a clock signal CK having a frequency of the frequency identifier "8." Next, the phase locked loop circuit 102 generates a clock signal CK having a frequency of the frequency identifier "7." Finally, the phase locked loop circuit 102 generates a clock signal CK having a frequency of the frequency identifier "1."

Next, the case when the current frequency identifier is "5" and the target frequency identifier is "11" will be explained. In this case, the phase locked loop circuit 102 is generating a clock signal CK having a frequency of the frequency identifier "5" at present. Next, the phase locked loop circuit 102 generates a clock signal CK having a frequency of the frequency identifier "9." Next, the phase locked loop circuit 102 generates a clock signal CK having a frequency of the frequency identifier "10." Finally, the phase locked loop circuit 102 generates a clock signal CK having a frequency of the frequency identifier "11."

Next, the case when the current frequency identifier is "5" and the target frequency identifier is "9" will be explained. In this case, the phase locked loop circuit 102 is generating a clock signal CK having a frequency of the frequency identifier "5" at present. Next, the phase locked loop circuit 102 generates a clock signal CK having a frequency of the frequency identifier "7." Next, the phase locked loop circuit 102 generates a clock signal CK having a frequency of the frequency identifier "8." Finally, the phase locked loop circuit 102 generates a clock signal CK having a frequency of the frequency identifier "9."

Next, the case when the current frequency identifier is "5" and the target frequency identifier is "1" will be explained. In this case, the phase locked loop circuit 102 is generating a clock signal CK having a frequency of the frequency identifier "5" at present. Next, the phase locked loop circuit 102 generates a clock signal CK having a frequency of the frequency identifier "4." Next, the phase locked loop circuit 102 generates a clock signal CK having a frequency of the frequency identifier "3." Finally, the phase locked loop circuit 102 generates a clock signal CK having a frequency of the frequency identifier "1."

Next, the case when the current frequency identifier is "1" and the target frequency identifier is "11" will be explained. In this case, the phase locked loop circuit 102 is generating a clock signal CK having a frequency of the frequency identifier "1" at present. Next, the phase locked loop circuit 102 generates a clock signal CK having a frequency of the frequency identifier "9." Next, the phase locked loop circuit 102 generates a clock signal CK having a frequency of the frequency identifier "10." Finally, the phase locked loop circuit 102 generates a clock signal CK having a frequency of the frequency identifier "11."

Next, the case when the current frequency identifier is "1" and the target frequency identifier is "9" will be explained. In this case, the phase locked loop circuit 102 is generating a clock signal CK having a frequency of the frequency identifier "1" at present. Next, the phase locked loop circuit 102 generates a clock signal CK having a frequency of the frequency identifier "7." Next, the phase locked loop circuit 102 generates a clock signal CK having a frequency of the frequency identifier "8." Finally, the phase locked loop circuit 102 generates a clock signal CK having a frequency of the frequency identifier "9."

Next, the case when the current frequency identifier is "1" and the target frequency identifier is "5" will be explained. In this case, the phase locked loop circuit 102 is generating a clock signal CK having a frequency of the frequency identifier "1" at present. Next, the phase locked loop circuit 102 generates a clock signal CK having a frequency of the frequency identifier "3." Next, the phase locked loop circuit 102 generates a clock signal CK having a frequency of the frequency identifier "4." Finally, the phase locked loop circuit 102 generates a clock signal CK having a frequency of the frequency identifier "5."

As described above, when the target frequency identifier is larger than the current frequency identifier, flags of three frequency identifiers on the high frequency side in the range of the current frequency identifier to the target frequency identifier are set to "1" and flags of the other frequency identifiers are set to "0." Further, when the target frequency identifier is smaller than the current frequency identifier, flags of three frequency identifiers on the high frequency side in the range of the current frequency identifier to the target frequency identifier are set to "1," a flag of the target frequency identifier is set to "1," and flags of the other frequency identifiers are set to "0."

Further, in a low frequency range out of the range of the current frequency identifier to the target frequency identifier, the frequency of the clock signal CK is changed by a first change amount, and in a high frequency range out of the range of the current frequency identifier to the target frequency identifier, the frequency of the clock signal CK is changed by a second change amount. The effect of a power supply noise is smaller in the low frequency range than in the high frequency range, so that the first change amount is made larger than the second change amount. This makes it possible to perform the change of the frequency and the speed level at high speed. The above-described low frequency range and high frequency range change according to the current frequency identifier and the target frequency identifier.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

By changing a frequency stepwise, a power supply noise can be prevented. Further, a frequency can be changed at high speed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase locked loop circuit control device, comprising:
a phase locked loop circuit configured to generate a clock signal; and a control unit configured to, when being instructed to change a frequency of the clock signal from a current frequency to a target frequency, control the phase locked loop circuit to make the frequency change stepwise from the current frequency to the target frequency, wherein the control unit changes the frequency of the clock signal by a first change amount in a first frequency range out of the range of the current frequency to the target frequency, and changes the frequency of the clock signal by a second change amount in a second frequency range out of the range of the current frequency to the target frequency.

2. The phase locked loop circuit control device according to claim 1, further comprising:

a power supply unit configured to generate a voltage, wherein the control unit comprises a speed level table configured to store therein a plurality of sets of frequency identifiers and voltage identifiers corresponding to speed levels, and the control unit, when being instructed to change the speed level from a current speed level to a target speed level, performs control to change the frequency of the clock signal from a frequency indicated by the frequency identifier corresponding to the current speed level to a frequency indicated by the frequency identifier corresponding to the target speed level, and change the voltage generated by the power supply unit from a voltage indicated by the voltage identifier corresponding to the current speed level to a voltage indicated by the voltage identifier corresponding to the target speed level.

3. The phase locked loop circuit control device according to claim 2, wherein the control unit comprises:

a frequency table configured to store therein a plurality of sets of the frequency identifiers and frequency information;

a voltage table configured to store therein a plurality of sets of the voltage identifiers and voltage information;

a frequency counter configured to count a value of the frequency identifier from the frequency identifier corresponding to the current speed level to the frequency identifier corresponding to the target speed level;

a voltage counter configured to count a value of the voltage identifier from the voltage identifier corresponding to the current speed level to the voltage identifier corresponding to the target speed level;

a frequency selector configured to select the frequency information corresponding to the frequency identifier counted by the frequency counter and output the selected frequency information to the phase locked loop circuit; and a voltage selector configured to select the voltage information corresponding to the voltage identifier counted by the voltage counter and output the selected voltage information to the power supply unit.

4. The phase locked loop circuit control device according to claim 3, wherein the frequency table stores therein a plurality of sets of the frequency identifiers, the frequency information, and flags, the frequency selector, according to the flag, selects the frequency information corresponding to the frequency identifier counted by the frequency counter and outputs the selected frequency information to the phase locked loop circuit, and the control unit determines the first change amount and the second change amount according to the flag.

5. The phase locked loop circuit control device according to claim 3, further comprising:

a frequency comparator configured to compare the frequency identifier in the speed level table corresponding to the target speed level with the frequency identifier counted by the frequency counter; and a voltage comparator configured to compare the voltage identifier in the speed level table corresponding to the target speed level with the voltage identifier counted by the voltage counter, wherein the frequency counter increments or decrements a value of the frequency identifier according to a comparison result of the frequency comparator, and the voltage counter increments or decrements a value of the voltage identifier according to a comparison result of the voltage comparator.

6. The phase locked loop circuit control device according to claim 2, wherein the control unit, when changing the frequency of the clock signal to decrease, changes the voltage generated by the power supply unit to decrease, and when changing the frequency of the clock signal to increase, changes the voltage generated by the power supply unit to increase.

7. The phase locked loop circuit control device according to claim 6, wherein the control unit, when being instructed to change the speed level to decrease the speed level, performs control to decrease the frequency of the clock signal and then performs control to decrease the voltage generated by the power supply unit, and the control unit, when being instructed to change the speed level to increase the speed level, performs control to increase the voltage generated by the power supply unit and then performs control to increase the frequency of the clock signal.

8. The phase locked loop circuit control device according to claim 2, wherein the control unit changes the voltage of the power supply unit stepwise from a current voltage of the power supply unit to a target voltage of the power supply unit by the same change amount.

9. The phase locked loop circuit control device according to claim 1, wherein the first frequency range and the second frequency range change according to the current frequency and the target frequency.

10. The phase locked loop circuit control device according to claim 4, wherein the flag in the frequency table changes according to the current frequency and the target frequency.

11. The phase locked loop circuit control device according to claim 1, wherein the second frequency range is a higher frequency range than the first frequency range.

12. The phase locked loop circuit control device according to claim 1, wherein the first change amount is larger than the second change amount.

13. A control method of a phase locked loop circuit being a control method of a phase locked loop circuit configured to generate a clock signal, the control method comprising:

controlling the phase locked loop circuit to make a frequency change stepwise from a current frequency to a target frequency by a control unit when being instructed to change the frequency of the clock signal from the current frequency to the target frequency; and changing the frequency of the clock signal by a first change amount in a first frequency range out of the range of the current frequency to the target frequency, and changing the frequency of the clock signal by a second change amount in a second frequency range out of the range of the current frequency to the target frequency by the control unit.

\* \* \* \* \*